United States Patent [19]

Shikata

[11] Patent Number: 4,962,054
[45] Date of Patent: Oct. 9, 1990

[54] METHOD FOR MANUFACTURING A FIELD EFFECT TRANSISTOR USING SPACERS OF DIFFERENT THICKNESSES

[75] Inventor: Shin-ichi Shikata, Yokohama, Japan

[73] Assignee: Sumitomo Electric Industries, Ltd., Osaka, Japan

[21] Appl. No.: 328,880

[22] Filed: Mar. 27, 1989

[30] Foreign Application Priority Data

Apr. 11, 1988 [JP] Japan .................................. 63-88759

[51] Int. Cl.⁵ .......................................... H01L 21/318
[52] U.S. Cl. ......................................... 437/40; 437/41; 437/39; 437/45; 437/912; 357/22
[58] Field of Search ....................... 437/39, 40, 41, 44, 437/45, 176, 175, 912, 944; 357/22, 23.3, 23.8

[56] References Cited

U.S. PATENT DOCUMENTS

| 4,722,909 | 2/1988 | Parrillo et al. | 437/34 |
| 4,728,621 | 3/1988 | Graf et al. | 437/41 |
| 4,729,966 | 3/1988 | Koshino et al. | 437/39 |
| 4,745,082 | 5/1988 | Kwok | 437/39 |
| 4,753,898 | 6/1988 | Parrillo et al. | 437/44 |
| 4,769,339 | 9/1988 | Ishii | 437/39 |

FOREIGN PATENT DOCUMENTS 0177129 4/1986 European Pat. Off. .............. 437/41
0114275 5/1987 Japan ..................................... 437/41

OTHER PUBLICATIONS

Matsuo, S., et al., "Low Temperature Chemical Vapor Deposition Method Utilizing an Electron Cyclotron Resonance Plasma", *Japanese J. Appl. Phys.*, vol. 22, No. 4, Apr. 1983, pp. L210-L212.

Primary Examiner—Brian E. Hearn
Assistant Examiner—T. N. Quach
Attorney, Agent, or Firm—Beveridge, DeGrandi & Weilacher

[57] ABSTRACT

In a method for manufacturing a field effect transistor, an inorganic material film is formed such that the film thickness of a resist pattern as a dummy gate or a refractory gate electrode in a gate region on a semiconductor substrate which faces a planned drain region is larger than the film thickness of a side wall facing a planned source region, and a impurities are doped into the semiconductor substrate at a high concentration using the resist pattern or the refractory gate electrode and the inorganic material film on the side walls thereof as the mask. As a result, the FET manufactured by the above process has a interval between the drain region and the gate electrode is larger than a interval between the source region and the gate electrode.

4 Claims, 6 Drawing Sheets

METHOD FOR MANUFACTURING A FIELD EFFECT TRANSISTOR USING SPACERS OF DIFFERENT THICKNESSES

BACKGROUND OF THE INVENTION

1. Field of the Invention

The present invention relates to a method for manufacturing a field effect transistor (FET), and more particularly to a method for manufacturing a Schottky gate field effect transistor (MESFET).

2. Related Background Art

In a MESFET, it has been proposed to make an interval between a drain n+ layer and a gate electrode larger than an interval between a source n+ layer and the gate electrode so that a drain break-down voltage is raised while a serial resistance is kept low to attain a low drain conductance.

As a manufacturing method for such an asymmetric structure MESFET, a method which uses a multi-layer dummy gate has been known. JP-A-61-194781 shows one manufacturing method therefore, in which a bilayer dummy gate is formed, a metal film such as aluminum (Al) is deposited on the surface of the dummy gate except a side wall facing the drain and a vicinity thereof, the lower layer of the dummy gate facing the drain is etched using the metal film as a mask to form an asymmetric T-shaped dummy gate structure, and the asymmetric structure MESFET is manufactured by using the asymmetric dummy gate.

In the related art, the dummy gate must be of multi-layer structure and it must be asymmetric T-shaped dummy gate structure. In order to form the asymmetric T-shaped dummy gate, a complex process including partial vapor deposition of the Al metal film, etching of only one side of the side walls of the lower layer of the dummy gate, and removal of the Al metal film is required.

SUMMARY OF THE INVENTION

A first object of present invention is to provide a method for manufacturing the field effect transistor which enables a FET having an interval between a drain region and a gate electrode larger than an interval between a source region and the gate electrode to be manufactured at a high yield.

A second object of present invention is to provide a method for manufacturing the field effect transistor which comprises steps of forming a relatively thin inorganic material film on a side wall of a dummy gate or refractory metal gate electrode facing a source, and forming a relatively thick inorganic material film is formed on the other side wall facing a drain, and implanting impurity ions at the high concentration using the dummy gate or refractory metal gate electrode and the inorganic material film on the sides thereof as a mask.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

FIGS. 1A-1H show a process sectional view in accordance with one embodiment of the present invention to manufacture an asymmetric MESFET having a LDD (lightly doped drain) structure. The LDD structure serves to relieve a high electric field created in a drain region by miniaturization of devices. It refers to a structure in which impurity regions of a relatively low concentration are formed in highly doped source and drain regions (contact regions) facing the gate.

Figure 1A:
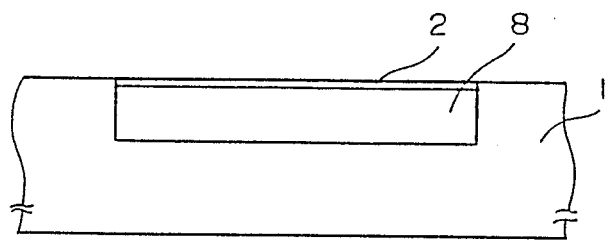
FIGS. 1A-1H show a process sectional view of one embodiment of the present invention.

A gallium arsenide (GaAs) substrate is first prepared as a semiconductor substrate 1, and n-type and p-type impurity ions are sequentially doped into areas where the FET is to be formed, through a photo-resist mask to form an n-type active layer 2 and a p-type buried layer 8 (see FIG. 1A).

Figure 1B:
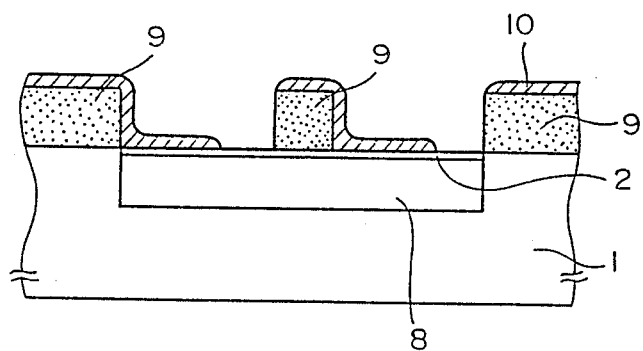

Then, resist is applied by a known spin coating method and a resist pattern 9 shown in FIG. 1B is formed by a known photolithography technique. The portion of the resist pattern 9 which is in the gate region is replaced by the gate electrode in a later step, and it acts as a dummy gate. A silicon nitride $SiN_x$) film 10 is formed by using an electron cyclotron resonance plasma chemical vapor depositiOn method (ECR plasma CVD method).

Figure 2:
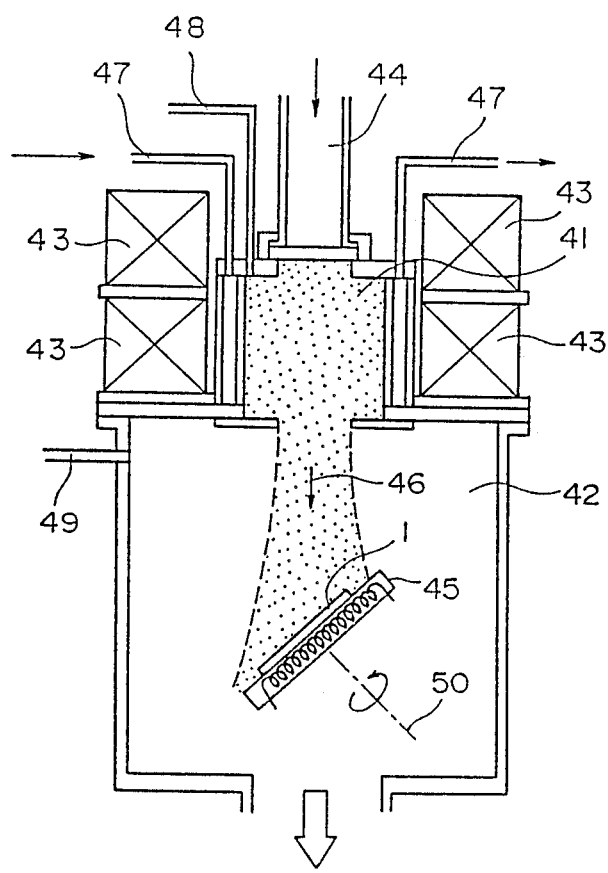
FIG. 2 shows a sectional view of an ECR plasma CVD apparatus used in the embodiment.

FIG. 2 shows a basic structure of an ECR plasma CVD apparatus for depositing the $SiN_x$ film 10 in the present embodiment. The ECR plasma CVD apparatus comprises a plasma chamber 41 and a deposition chamber 42. A magnetic coil 43 is disposed around the plasma chamber 41 and a microwave rectangular wave guide 44 is disposed above the plasma chamber 41 with a microwave transparent isolation plate being interposed therebetween. A sample table 45 on which the semiconductor substrate 1 is mounted is arranged in the deposition chamber 42 at an angle of 45° relative to a flow direction 46 of plasma flow. The sample table 45 is rotatable around an axis 50 which extends centrally and which is normal to the surface of the sample table 45. Numeral 47 denotes a coolant pipe, numeral 48 denotes a plasma generation gas inlet pipe, and numeral 49 denotes a reaction gas inlet pipe.

In this ECR plasma CVD apparatus, $N_2$, $NH_3$, $O_2$ or Ar gas or mixture thereof is supplied through the plasma generation gas inlet pipe 48 into the plasma chamber 41 in which the ECR condition has been set by the microwave and the magnetic field, and the plasmanized gas is guided by the diverging magnetic field into the deposition chamber 42. On the other hand, insulative film forming gas such as $SiH_4$, $Si_2H_6$ or $Si_3H_8$ is supplied into the deposition chamber 42 through the reaction gas inlet pipe 49 and it is excited and activated by the plasma and reacts so that reaction product is deposited on the substrate. A $SiN_x$ film is presently formed as the inorganic material film (insulator film) formed by the ECR plasma CVD method, and silicon oxide ($SiO_2$) or silicon nitride oxide ($SiO_xN_y$) film may also be formed. The ECR plasma CVD method is disclosed in Japanese Journal of Applied Physics Letter, Vol. 22, No. 4, ppL210–L212, 1983.

In the present embodiment, the silicon nitride is deposited while the sample table 45 of the ECR plasma CVD apparatus is fixed at a predetermined position. Since the plasma flow 46 of the ECR plasma CVD has a high directivity, the silicon nitride is deposited to the surface of the semiconductor substrate 1 from the oblique above thereof at an angle of 45° and the $SiN_x$ film 10 is formed except on one side wall of the resist pattern 9 and a shade area thereof (see FIG. 1B).

Thereafter, the silicon nitride is deposited while the sample table 45 is rotated around the axis 50 so that the deposition is done uniformly over the entire surface of the semiconductor substrate 1. Thus, the silicon nitride is deposited on the deposition of the silicon nitride made in the previous stage and the deposition is also made on the other side of the resist pattern 9 and the shade area thereof to which no deposition of the silicon nitride was made in the previous stage. As a result, the silicon nitride ($SiN_x$) film 10 as shown in FIG. 1C, that is, the $SiN_x$ film 10 having different film thicknesses at the right and left side walls of the dummy gate is formed.

In order to attain the LDD structure, it is necessary to leave the $SiN_x$ film 10 on the sides of the resist pattern 9 as spacers $10_a$ and $10_b$. To this end, a certain degree of fineness is required for the $SiN_x$ film 10. This is well satisfied by using the ECR plasma CVD method. Since the ECR plasma CVD method allows the process at a low temperature, the resist pattern is not modified and the lifting-off in a later step is facilitated.

Figure 1C:
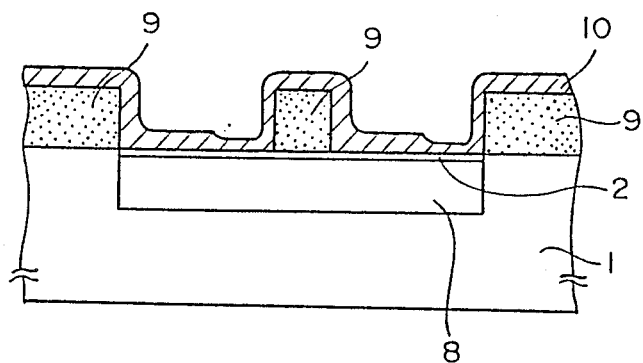

The $SiN_x$ film 10 formed as shown in FIG. 1C is etched from above by a reactive ion etching (RIE) method. When the $SiN_x$ film 10 on the top of the semiconductor substrate 1 and on the top of the resist pattern 9 is removed, the $SiN_x$ film is left on the sides of the gate region resist pattern 9 as the spacers $10_a$ and $10_b$. The spacer $10_a$ facing the source is thinner than the spacer $10_b$ facing the drain.

Figure 1D:
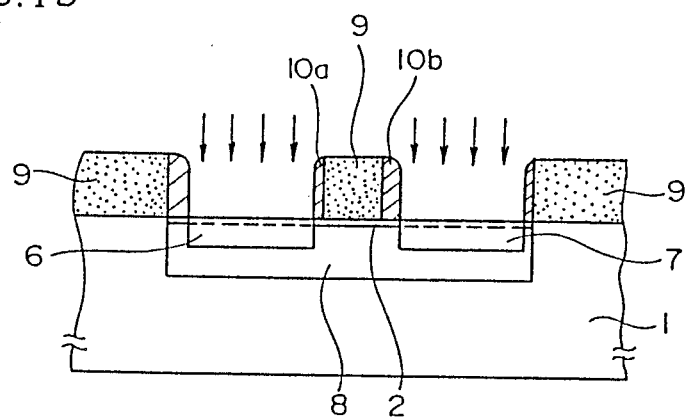

Then, high concentration impurities are doped as shown by arrows in FIG. 1D to form $n^{++}$ regions which serve as the source region 6 and the drain region 7. The $n^{++}$ region is not formed in an area where the resist pattern 9 or spacer $10_a$ or $10_b$ exists.

Figure 1E:
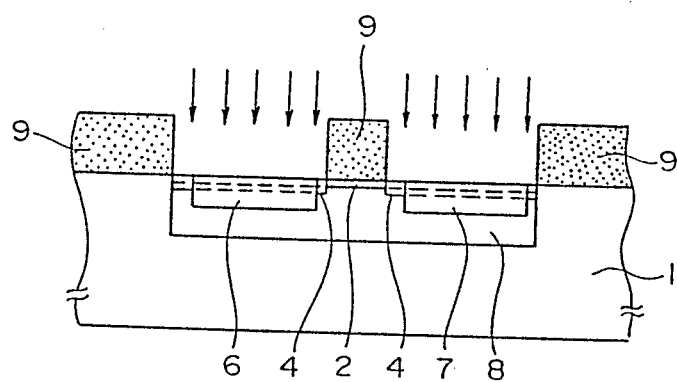

Then, the $SiN_x$ films of the spacers $10_a$ and $10_b$ are removed by buffered hydrofluoric acid, and n-type impurities are doped as shown by arrows in FIG. 1E. As a result, $n^+$ impurity regions 4 having a lower concentration than the $n^{++}$ regions are formed at end areas of the source region 6 and the drain region 7 facing the gate region. In this manner, the LDD structure is attained. This step of forming $n^+$ impurity regions 4 may be eliminated for a manufacture of a MESFET having no LDD structure.

Figure 1F:
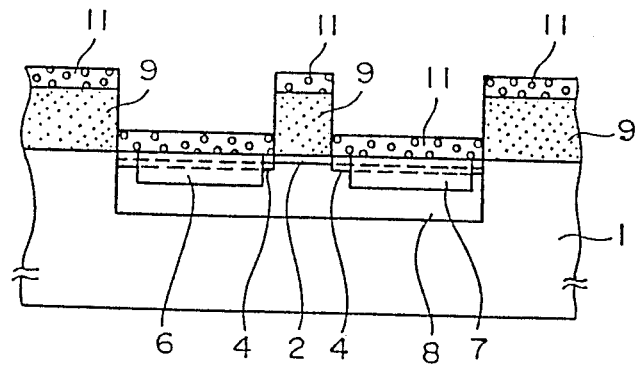
Figure 1G:
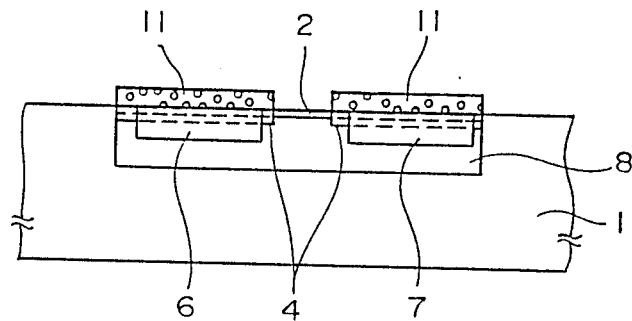
Figure 1H:
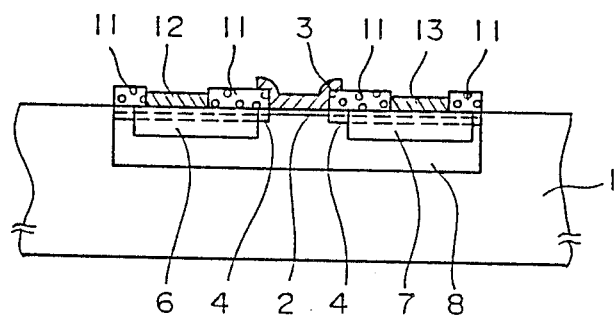

Then, $SiN_x$ films 11 are formed by the ECR plasma CVD method, as shown in FIG. 1F. Because the plasma has a high directivity, the $SiN_x$ film 11 is not formed on the sides of the resist pattern 9 when the semiconductor substrate 1 is kept perpendicular to the ECR plasma. Accordingly, a structure shown in FIG. 1G is easily attained by the lift-off process by acetone. The $SiN_x$ reversal pattern which is an exact reversal pattern to the substitutional resist pattern 9 is obtained. By annealing it in an $AsH_3$ atmosphere at approximately 800° C., the impurity doped areas are activated.

Openings are then formed in the $SiN_x$ films 11 and ohmic electrodes 12 and 13 are formed. A Schottky metal is deposited on the entire surface including the gate region, and the gate electrode 3 is formed by the lift-off process. Thus, an FET having the gate electrode 3 formed by the self-alignment process is formed (see FIG. 1H).

In this FET, since the spacer $10_b$ is thicker than the spacer $10_a$, the interval between the drain region 7 and the gate electrode 3 is larger than the interval between the source region 6 and the gate electrode 3 depending on the difference between the film thicknesses. As a result, a drain breakdown voltage is improved over an FET which has the spacers $10_a$ and $10_b$ of equal thickness.

In the present embodiment, since the gate electrode 3 is formed after the annealing, the Schottky metal may be Ti/Pt/Au or La $B_6$ instead of a refractory metal. Since the gate electrode 3 is not subjected to a high temperature process, the Schottky characteristic is not deteriorated.

Specific examples of the method for manufacturing the field effect transistor of the present invention are now explained, although the present invention is not limited to those examples.

EXAMPLES

A field effect transistor was formed on a substrate in accordance with the process of the present invention shown in FIGS. 1A–1H, in the manner described below.

First, a GaAs substrate was prepared as the semiconductor substrate 1, and a photo-resist (Az-1400) was applied over the entire surface thereof. After a predetermined pattern was exposed, it was developed to form the resist pattern. Then, $^{29}Si^+$ was lightly doped at an acceleration voltage of 30–70 kilovolt (KV) using the resist formed on the substrate as a mask, to form the n-type active layer 2. And $Be^+$ was doped at an acceleration voltage of 50–100KV using the resist as a mask, to form the p-type buried layer 8. Then, the resist pattern was removed, and a photo-resist film (AZ-1400) was again applied over the entire surface of the substrate. Another predetermined pattern was exposed thereto and it was developed to form the resist pattern (substitution pattern, the dummy gate) as shown in FIG. 1B.

Then, the $Si_3N_4$ film 10 as shown in FIG. 1B was formed to the thickness of approximately 1000 Å by using gas mixture of $SiH_4$, $NH_3$ and $N_2$ while the rotation of the sample table 45 of the ECR plasma CVD apparatus shown in FIG. 2 was stopped at an appropriate position. Then, the ECR plasma CVD was continued while the sample table 45 was rotated to form the $Si_3N_4$ film 10 as shown in FIG. 1C. Through the two-stage film formation process, the film thickness of the side wall of the dummy gate facing the source was approximately 1000 Å, and the film thickness of the side wall facing the drain was approximately 2000 Å.

Then, the $Si_3 N_4$ film in the flat area was removed by the RIE method to leave the $Si_3 N_4$ films only on the side walls of the resist pattern as the spacers $10_a$ and $10_b$, as shown in FIG. 1D.

Under this condition, $^{28}Si^+$ was implanted at an acceleration voltage of 80–200 KV to form the $n^{++}$ source region 6 and drain region 7 having a doping concentration of approximately $3 \times 10^{13}/\text{cm}^2$, as shown in FIG. 1D.

Then, the spacers 10a and 10b on the side walls of the resist pattern 9 were removed as shown in FIG. 1E by slight etching by using buffered hydrofluoric acid. Under this condition, $^{28}\text{Si}^+$ was implanted at an acceleration voltage of approximately 100KV to form the n+ region 4 of in the order of $10^{12}/\text{cm}^2$ in order to attain the LDD structure.

Then, the $\text{Si}_3\text{N}_4$ film 11 was formed by the ECR plasma CVD method perpendicularly to the substrate (FIG. 1F), and the $\text{Si}_3\text{N}_4$ film 11 on the resist pattern was removed by the lift-off process in which the resist pattern was removed by acetone, to form the $\text{Si}_3\text{N}_4$ film (reversal pattern) having the openings as shown in FIG. 1G.

The substrate was then annealed for 30 minutes in the $\text{AsH}_3$ atmosphere at approximately 800° C. The annealing was done in the $\text{AsH}_3$ atmosphere in order to prevent As from evaporating from the GaAs substrate. Where the anneal protection film is formed over the entire surface of the substrate, the annealing may be done in an inert atmosphere such as $\text{N}_2$.

A resist pattern having openings which align to the openings in the $\text{Si}_3\text{N}_4$ film 11 and which are larger than the openings of the $\text{Si}_3\text{N}_4$ film 11 was formed on the substrate. The source electrode 12 and the drain electrode 13 were formed in the source region and the drain region by a known method. Then, a Ti/Pt/Au electrode material was vapor-deposited on the entire surface thereof, and the resist pattern was removed and the self-alignment gate electrode 3 was formed by the lift-off process to form the MESFET shown in FIG. 1H.

In the present example, the low concentration region 4 for the LDD structure was formed after the source-/drain regions 6 and 7 had been formed. Alternatively, n-type impurities may be ion-implanted using the dummy gate as the mask immediately after the formation of the dummy gate to form the low concentration impurity region 4.

FIGS. 3A–3E shows a process sectional view of another embodiment of the present invention. The present embodiment is similar to the embodiment of FIGS. 1A–1H in that it manufactures a MESFET of the LDD structure but it differs in that it uses a refractory metal for the gate electrode.

Figure 3A:
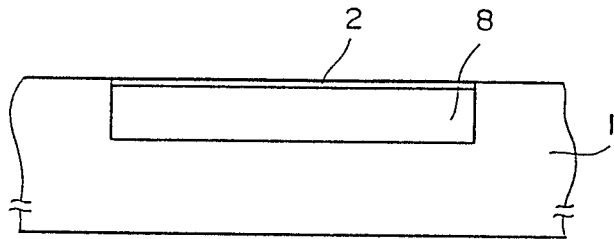
FIGS. 3A-3E show a process sectional view of another embodiment of the present invention.

A GaAs substrate is prepared as the semiconductor substrate 1, and n-type and p-type impurity ions are sequentially implanted through the photo-resist mask to form the n-type active layer 2 and the p-type buried layer 8, as they are done in the embodiment of FIGS. 1A–1H (see FIG. 3A).

Figure 3B:
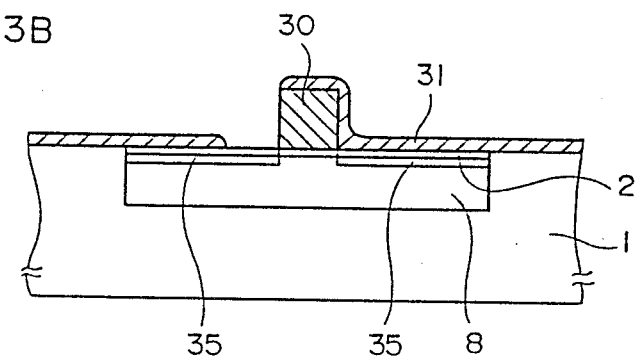
Figure 3C:
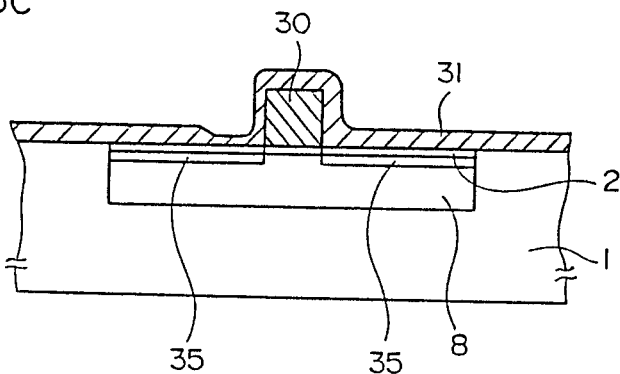
Figure 3D:
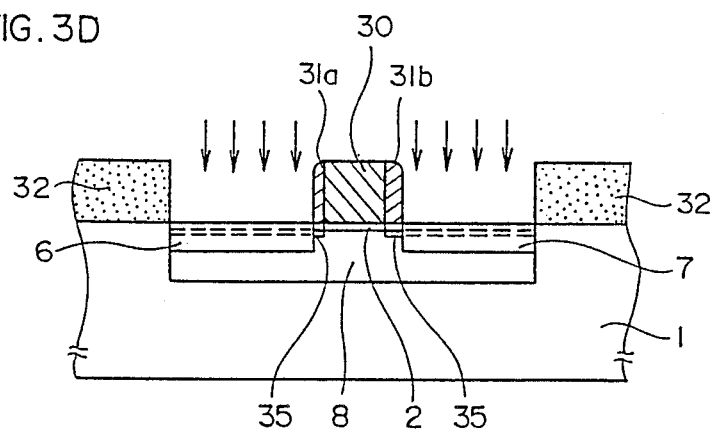

Then, a refractory metal tungsten silicide (WSi) is sputtered to the surface of the semiconductor substrate 1, and a gate electrode 30 is formed on the active layer 2 as shown in FIG. 3A by $\text{CF}_4$ gas plasma etching. Then, n-type impurities are implanted using the gate electrode 30 as a mask to form the n+ low concentration impurity region 35 for the LDD structure. Then, a silicon nitride $\text{SiN}_x$) film 31 which is an inorganic material film is formed by the ECR plasma CVD method. The deposition of the silicon nitride in this step is done first while the sample table 45 is fixed at a predetermined position and then it is done while the sample table 45 is rotated, as it is in the embodiment of FIG. 1. As a result, the silicon nitride film 31 is first formed except on the side wall of the gate electrode 30 facing the source and the substrate surface 2 in the vicinity thereof as shown in FIG. 3B, and then it is deposited on the side wall of the gate electrode 30 facing the source and the substrate surface in the vicinity thereof. The film thickness of the side wall of the gate electrode 30 facing the drain is thicker than the film thickness of the side wall facing the source.

The silicon nitride film 31 thus formed is etched from the above thereof by the RIE method so that the spacers 31a and 31b are left on the both side walls of the gate electrode 30. Then, a photo-resist is applied and it is patterned to form a resist pattern 32. High concentration impurities are implanted as shown by arrows in FIG. 3D using the resist pattern 32, the gate electrode 30 and the spacers 31a and 31b as a mask to from the N++ regions which serve as the source region 6 and the drain region 7. The n++ region is not formed in the area where the resist pattern 32, the gate electrode 30 or the spacer 31a or 31b exists. Since the film thickness of the spacer 31b is larger than the film thickness of the spacer 31a, the interval between the drain region 7 and the gate electrode 30 is larger than the interval between the source region 6 and the gate electrode 30.

The resist pattern 32 is then removed by acetone and the substrate is annealed in the $\text{AsH}_3$ atmosphere at approximately 800° C. so that the impurity doped areas are activated.

Figure 3E:
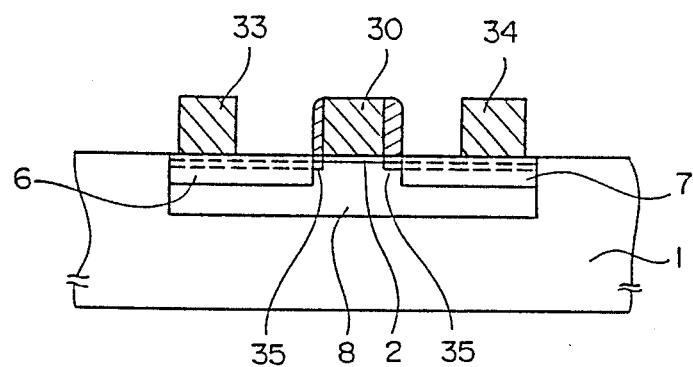

Then, ohmic electrodes are formed in the source region 6 and the drain region 7 to form the source electrode 33 and the drain electrode 34 of the MESFET shown in FIG. 3E.

In this MESFET, since the interval between the drain region 7 and the gate electrode 30 is larger than the interval between the source region 6 and the gate electrode 30, a drain breakdown voltage is high and a drain conductance is low.

The both embodiments described herein relate to the manufacture of the MESFET of the LDD structure, but they may be applied to the manufacture of the MESFET having no LDD structure by eliminating the step of forming the low concentration impurity region 4 or 35.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A method for manufacturing a field effect transistor, said method comprising the steps of:
   (A) forming a resist pattern corresponding to a gate region on a semiconductor substrate;
   (B) depositing an inorganic material on a surface of the substrate by directing the inorganic material from above the substrate onto the substrate surface in a direction oblique to the substrate surface by the use of an electron cyclotron resonance plasma CVD method, said depositing step including a first step of depositing the organic material as the substrate is held in a fixed position, and a second step of further depositing the inorganic material while the substrate is rotated about an axis normal to the surface thereof;
   (C) etching to remove the inorganic material from a predetermined region to form inorganic material films having different thicknesses on side walls of the resist pattern;

(D) doping the semiconductor substrate with impurities to a high impurity concentration while using the resist pattern and the inorganic material films on the side walls thereof as a mask to provide a source region and a drain region;
(E) removing the remaining inorganic material films from the substrate;
(F) providing a reversal pattern on the semiconductor substrate by forming an insulative film on the substrate and thereafter removing the resist pattern;
(G) forming a self-alignment gate electrode on the semiconductor substrate in the gate region by using the reversal pattern as a mask;
(H) forming a drain electrode in the drain region; and
(I) forming a source electrode in the source region.

2. A method for manufacturing a field effect transistor according to claim 1 wherein after step (A) or step (D), said method comprises a step of doping the semiconductor substrate using the resist pattern as a mask to form an impurity region having a lower concentration than the source/drain regions.

3. A method for manufacturing a field effect transistor, said method comprising the steps of:
(A) forming a gate electrode made of a refractory metal in a gate region of a semiconductor substrate;
(B) depositing an inorganic material on a surface of the substrate by directing the inorganic material from above the substrate onto the substrate surface in a direction oblique to the substrate surface by the use of an electron cyclotron resonance plasma CVD method, said depositing step including a first step of depositing the inorganic material as the substrate is held in a fixed position, and a second step of further depositing the inorganic material while the substrate is rotated about an axis normal to the surface thereof;
(C) etching deposited inorganic material along a direction normal to the surface of the substrate to remove the inorganic material from a predetermined region and thereby form inorganic material films having different thicknesses on side walls of the gate electrode;
(D) doping the semiconductor substrate with impurities to a high impurity concentration while using the gate electrode and the inorganic material films on the side walls thereof as a mask to provide a source region and a drain region;
(E) removing the remaining inorganic material films from the substrate;
(F) forming a drain electrode in the drain region, and
(G) forming a source electrode in the source region.

4. A method for manufacturing a field effect transistor according to claim 3 wherein after step (A), said method comprises a step of doping the semiconductor substrate while using the gate electrode as a mask to form an impurity region having a lower concentration than the source/drain regions.

* * * * *